United States Patent
Kang et al.

(10) Patent No.: US 7,245,644 B2
(45) Date of Patent: Jul. 17, 2007

(54) SEMICONDUCTOR MONOLITHIC INTEGRATED OPTICAL TRANSMITTER

(75) Inventors: Byung-Kwon Kang, Suwon-shi (KR); Shi-Yun Cho, Seoul (KR); In Kim, Suwon-shi (KR); Do-Young Rhee, Seoul (KR); Tae-Il Kim, Suwon-shi (KR); Dong-Hoon Jang, Suwon-shi (KR); Seung-Won Lee, Suwon-shi (KR); Duk-Ho Jeon, Anyang-shi (KR); June-Hyeon Ahn, Suwon-shi (KR); Young-Min Lee, Yongin-shi (KR); Jong-Ryeol Kim, Suwon-shi (KR)

(73) Assignee: Samsung Electronics Co., Ltd., Yeongtong-Gu, Suwon-si, Gyeonggi-Do (KR)

( * ) Notice: Subject to any disclaimer, the term of this patent is extended or adjusted under 35 U.S.C. 154(b) by 646 days.

(21) Appl. No.: 10/716,653

(22) Filed: Nov. 19, 2003

(65) Prior Publication Data
US 2005/0006654 A1    Jan. 13, 2005

(30) Foreign Application Priority Data
Jul. 8, 2003    (KR)    ............... 10-2003-0046204

(51) Int. Cl.
*H01S 5/00*    (2006.01)

(52) U.S. Cl. ............... 372/50.1; 372/50.11; 372/50.22
(58) Field of Classification Search ............... 372/50.1, 372/50.11, 50.22, 50.2
See application file for complete search history.

(56) References Cited

U.S. PATENT DOCUMENTS

2005/0018720 A1*    1/2005    Kish et al. ............... 372/20

\* cited by examiner

*Primary Examiner*—Dung (Michael) T. Nguyen
(74) *Attorney, Agent, or Firm*—Cha & Reiter, LLC

(57) ABSTRACT

A semiconductor monolithic integrated optical transmitter including a plurality of active layers formed on a semiconductor substrate is disclosed, which comprises: a distributed feedback laser diode including a grating for reflecting light with a predetermined wavelength and a first active layer for oscillating received light from the grating; an electro-absorption modulator including a second active layer for receiving light from the first active layer, wherein the received light intensity is modulated through a change of absorbency in accordance with an applied voltage; an optical amplifier including a third active layer for amplifying received light from the second active layer; a first optical attenuator between the first active layer and the second active layer; and a second optical attenuator between the second active layer and the third active layer.

19 Claims, 9 Drawing Sheets

SEMICONDUCTOR MONOLITHIC INTEGRATED OPTICAL TRANSMITTER

CLAIM OF PRIORITY

This application claims priority to an application entitled "Semiconductor monolithic integrated optical transmitter," filed in the Korean Intellectual Property Office on Jul. 8, 2003 and assigned Ser. No. 2003-46204, the contents of which are hereby incorporated by reference.

BACKGROUND OF THE INVENTION

1. Field of the Invention

The present invention relates to a semiconductor optical device, and more particularly to a semiconductor optical transmitter.

2. Description of the Related Art

As Internet communication rapidly increases, the need for improved optical communication speed and facilities also increases. Further, rapid depreciation in optical part prices has promoted the construction of a new ultra-high speed communication environment. In such an environment, technologies are capable of realizing a modulation speed of more than 10 Gbps. In addition, long-distance transmission of more than 80 km without an erbium doped fiber amplifier (EDFA) have attracted considerable attention. Advantageously, the removal of high-priced optical amplifier parts in an optical fiber transmission line provides not only a reduction in price but also in the maintenance of facilities. Further, for an ultra-high speed long-distance transmission, a high-power optical transmitter and a high-sensitivity optical detector, which can transmit optical signals, are necessary even if a loss of optical fiber exists.

FIG. 1 is an optical transmitter according to one example of the prior art. The optical transmitter 100 includes a distributed feedback laser diode (hereinafter, referred to as DFB LD) 110, an isolator (hereinafter, referred to as ISO) 120 and a Mach-Zehnder modulator (hereinafter, referred to as M-Z MOD) 130. The DFB LD 110 continuously outputs high-power lights and the M-Z MOD 130 modulates the inputted light into communication signals at high-speed. Since the DFB LD 110 easily distorts output light due to fed-back light such as reflected light, the ISO 120 is inserted between the DFB LD 110 and the M-Z MOD 130 in order to prevent the distortion. The ISO 120 passes light inputted in one direction and isolates light inputted in other direction.

FIG. 2 is an optical transmitter according to another example of the prior art. The optical transmitter 200 includes a DFB LD 210, a first and a second ISO 220 and 240, an electro-absorption modulator (hereinafter, referred to as EA MOD) 230 and a semiconductor optical amplifier (hereinafter, referred to as SOA) 250. The DFB LD 210 continuously outputs high-power light and the EA MOD 230 modulates the inputted light into communication signals at high-speed. The SOA 250 compensates for optical loss in the EA MOD 230 by amplifying and outputting the inputted light. Further, the SOA 250 partially compensates for frequency chirp that is generated in the EA MOD 230. The first ISO 220 is disposed between the DFB LD 210 and the EA MOD 230. The second ISO 240 is disposed between the EA MOD 230 and the SOA 250. Each of the first and the second ISOs 220 and 240 passes light inputted in one direction and isolates light inputted in other direction.

However, in such a conventional optical transmitter 100, since each part is expensive, the entire cost of the optical transmitter 100 becomes very expensive. Further, in order to prevent transmission light from being distorted due to reverse-direction light such as reflected lights in connecting optical elements, it is essential to employ the ISO 120. Moreover, each part has a size of several cm by several cm and optical fibers are used to connect parts with each other. Thus, the optical transmitter 100 has an increased overall size of several tens of cm by several tens of cm. To maintaining stable operation of each part, temperature must be kept constant. Power consumption of the optical transmitter 100 becomes very great since each part consumes a large amount of power.

Further, in such a conventional optical transmitter 200, as shown in FIG. 2, high-priced parts with wide amplification band and low polarization dependency must be employed. These parts are needed since the SOA 250 is affected by conditions of the wavelength of the DFB LD 210 and a polarization of light outputted in the EA MOD 230.

SUMMARY OF THE INVENTION

Accordingly, the present invention has been made to reduce or overcome the above-mentioned limitations occurring in the prior art. One object of the present invention is to provide a semiconductor monolithic integrated optical transmitter capable of performing high-speed modulation, obtaining a high power and minimizing a distortion of light.

An other object of the present invention is to provide a subminiature semiconductor monolithic integrated optical transmitter which has low power consumption, is ultra-miniaturized and low-priced. In addition, it can eliminate the necessity for consideration of a polarization dependency of a semiconductor optical amplifier.

In accordance with the principles of the present invention, a semiconductor monolithic integrated optical transmitter is provided, that includes a plurality of active layers formed on a semiconductor substrate comprising: a distributed feedback laser diode including a grating for reflecting light with a predetermined wavelength and a first active layer for oscillating received light from the grating; an electro-absorption modulator including a second active layer for receiving light from the first active layer, wherein the received light intensity is modulated through a change of absorbency in accordance with an applied voltage; an optical amplifier including a third active layer for amplifying received light from the second active layer; a first optical attenuator between the first active layer and the second active layer; and a second optical attenuator between the second active layer and the third active layer.

BRIEF DESCRIPTION OF THE DRAWINGS

The present invention will be more apparent from the following detailed description taken in conjunction with the accompanying drawings, in which.

DETAILED DESCRIPTION OF THE PREFERRED EMBODIMENT

Hereinafter, a preferred embodiment according to the present invention will be described with reference to the accompanying drawings. In the following description of the present invention, a detailed description of known functions and configurations incorporated herein will be omitted when it may make the subject matter of the present invention rather unclear.

Figure 1:
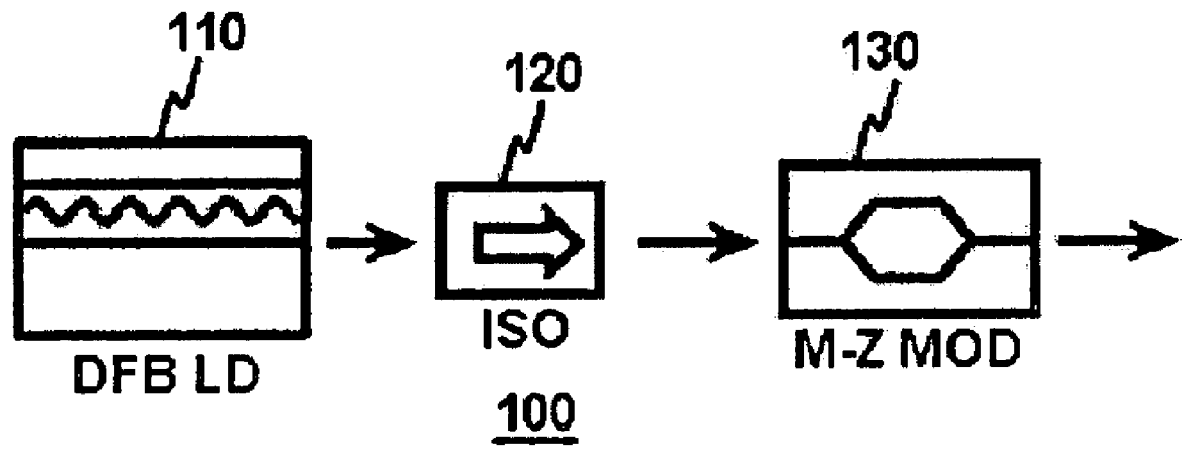
FIG. 1 is an optical transmitter according to one example of the prior art.
Figure 2:
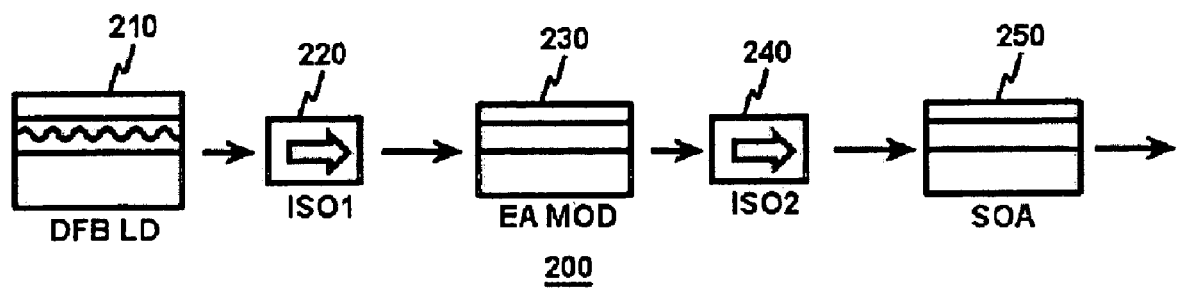
FIG. 2 is an optical transmitter according to another example of the prior art.
Figure 3:
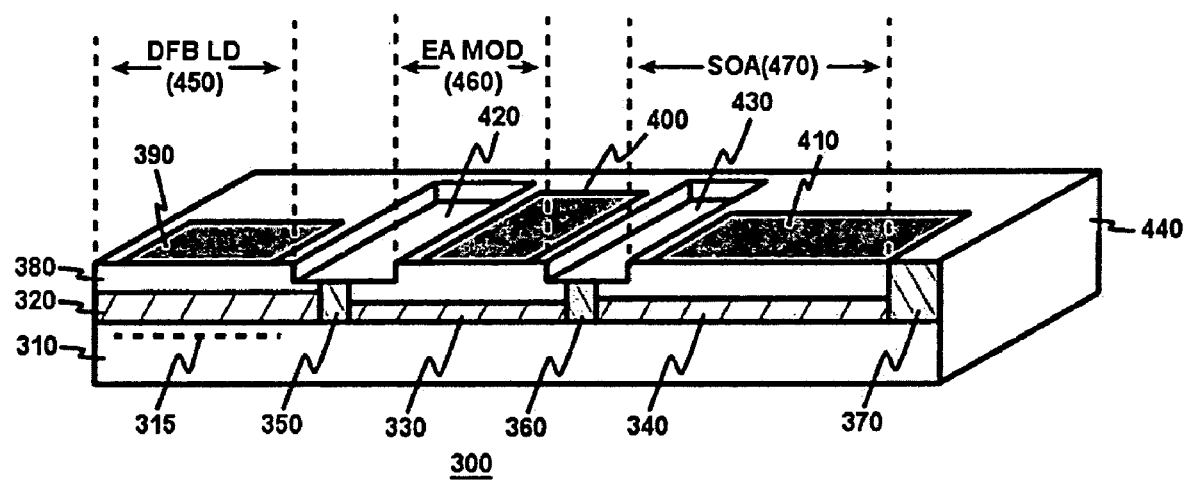
FIG. 3 is a perspective view of a monolithic integrated optical transmitter according to a preferred embodiment of the present invention.
Figure 4:
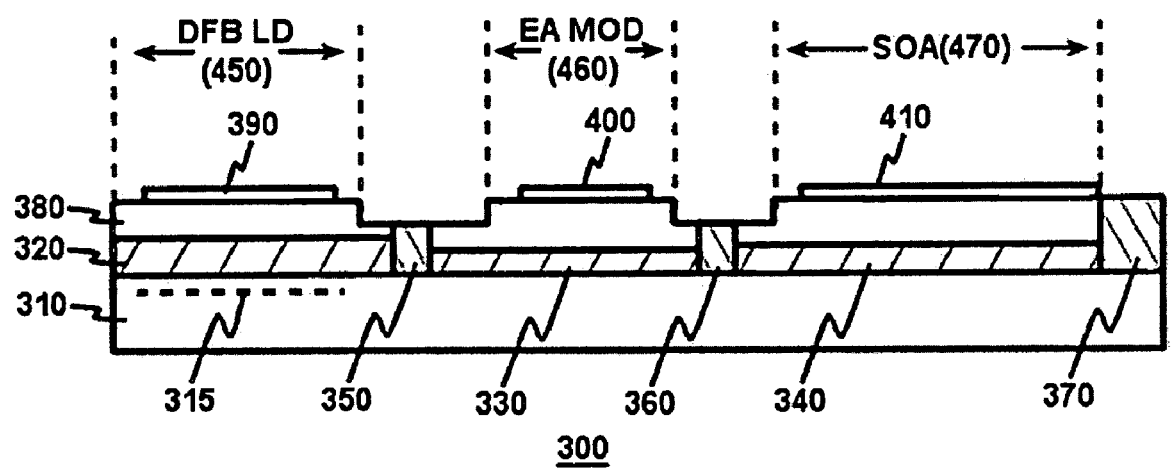
FIG. 4 is a cross-sectional view of the monolithic integrated optical transmitter shown in FIG. 3.

FIG. 3 is a perspective view of a monolithic integrated optical transmitter according to a preferred embodiment of the present invention. FIG. 4 is a cross-sectional view of the monolithic integrated optical transmitter shown in FIG. 3. The optical transmitter 300 has a monolithic integrated structure with a plurality of layers laminated on one semiconductor substrate 310. The plurality of layers includes a distributed feedback laser diode (hereinafter, referred to as DFB LD) 450 for oscillating light, an electro-absorption modulator (hereinafter, referred to as EA MOD) 460 for an optical intensity modulation, and a semiconductor optical amplifier (hereinafter, referred to as SOA) 470 for an optical amplification. The optical transmitter 300 further includes a first and a second optical attenuator 350 and 360 for an optical attenuation, an antireflection layer 440 and a first to a third electrode 390, 400 and 410.

Hereinafter, manufacturing process of the optical transmitter 300 will be described with reference to FIGS. 3 and 4. The manufacturing process includes:

1) The semiconductor substrate 310, made from an n-InP, is made ready. A common electrode (not shown) is formed on a lower surface of the substrate 310. Selectively, a lower clad layer, made from the n-InP, is formed on the semiconductor substrate 310.

2) A diffraction grating is formed on a predetermined area on the semiconductor substrate 310 in which the DFB LD will be formed. The diffraction grating may be formed on the semiconductor substrate 310 by etching the semiconductor substrate 310. A photolithography process is used to form a photoresist layer with a grating pattern.

3) A first to a third active layer 320, 330 and 340 in the DFB LD 450, the EA MOD 460 and the SOA 470 are simultaneously grown on the semiconductor substrate using a selective growth process. Herein, the first to the third active layers 320, 330 and 340 are made from InGaAsP. They also have a multiple quantum well structure. Further, the first to the third active layers 320, 330 and 340 grow to have different energy bandgaps from each other.

4) In forming the first to the third active layers 320, 330 and 340 on a waveguide structure by means of a photolithography process, boundary areas are etched at the same time. The boundary areas are between active layers and an end of the third active layer 340, which is spaced away from the boundary areas.

5) The first and the second optical attenuators 350 and 360 made from InP and a window 370 with the same material are also grown in the etched areas.

6) An upper clad layer 380 made from p-InP is formed on the first to the third active layer 320, 330 and 340, the first and the second optical attenuator 350 and 360, and the window 370.

7) The first to the third electrodes 390, 400 and 410, which correspond to the first to the third active layer 320, 330 and 340 in a one-to-one fashion, are formed on the upper clad layer 380. Each of the first to third active layers 320, 330 and 340 and the corresponding first to third electrodes 390, 400 and 410 are vertically aligned.

8) Parts of the upper clad layer 380 exposed between the first electrode 390 and the second electrode 400 and exposed between the second electrode 400 and third electrode 410 are etched to a predetermined depth. Therefore, a first and a second trench 420 and 430 are formed. Through these steps, the DFB LD 450, the EA MOD 460 and the SOA 470 are formed on the semiconductor substrate 310.

9) An antireflection layer 440 made from a dielectric is coated on one end of the SOA 470 side, from both sides of the optical transmitter 300.

Figure 5A:
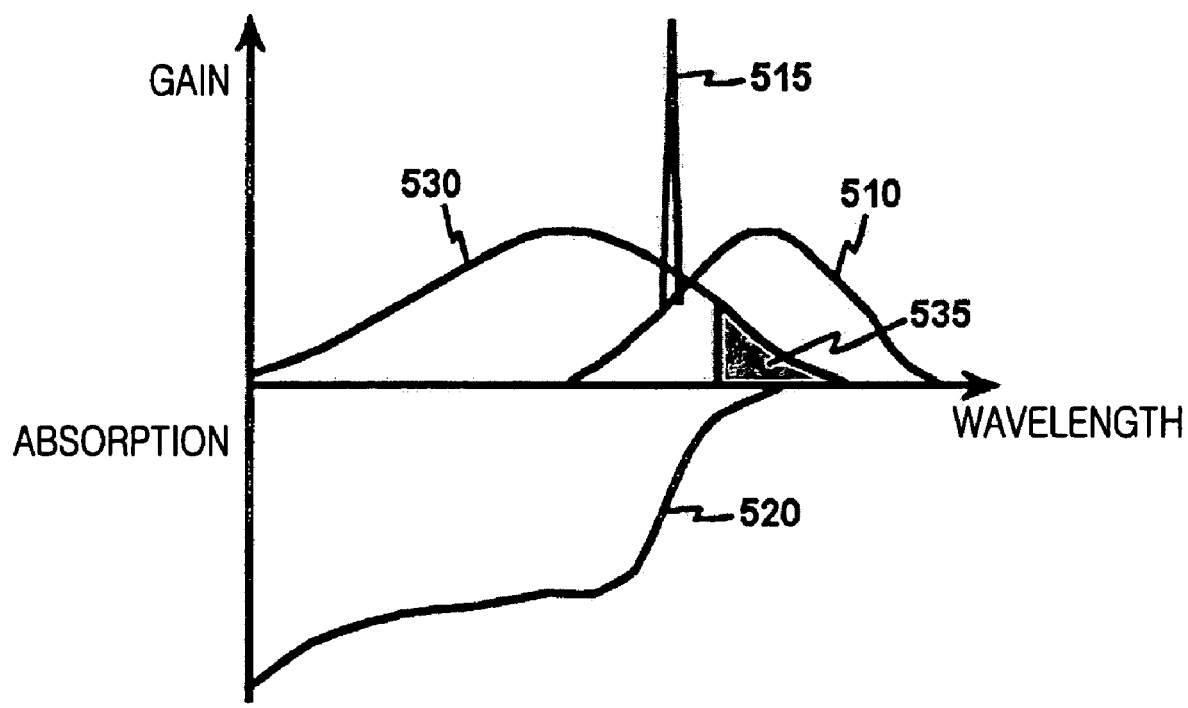
FIGS. 5a and 5b are views illustrating variation of an absorption curve of the electro-absorption modulator shown in FIG. 3, according to the on and off state of light.
Figure 5B:
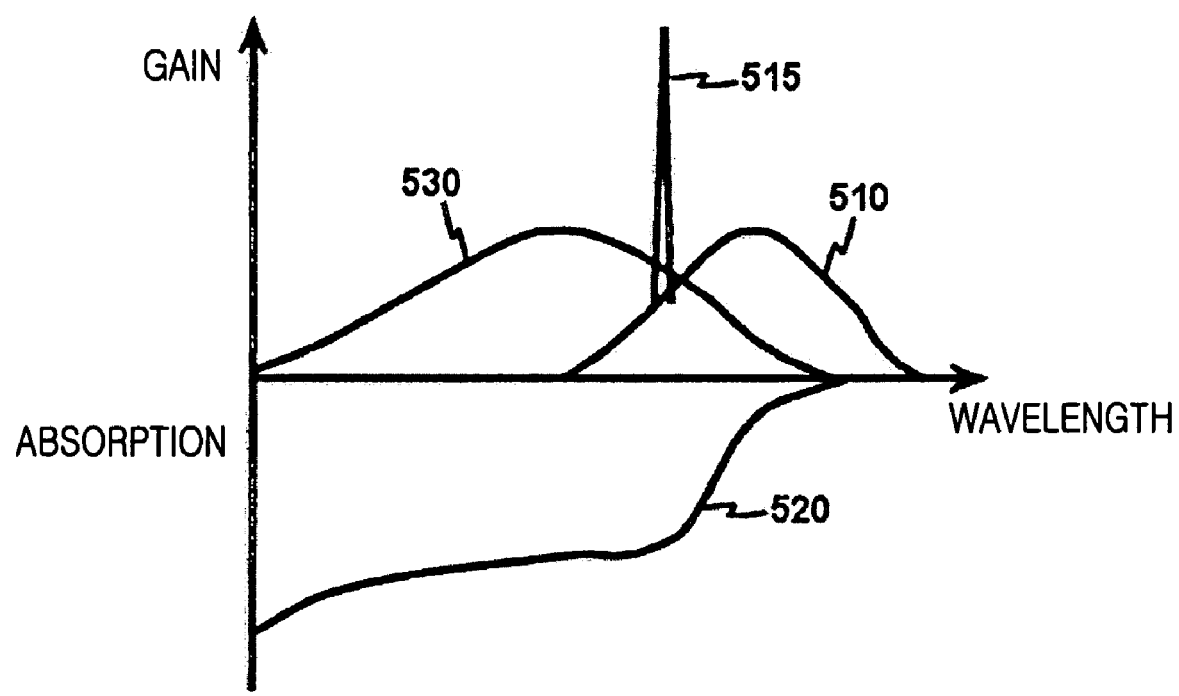
Figure 6:
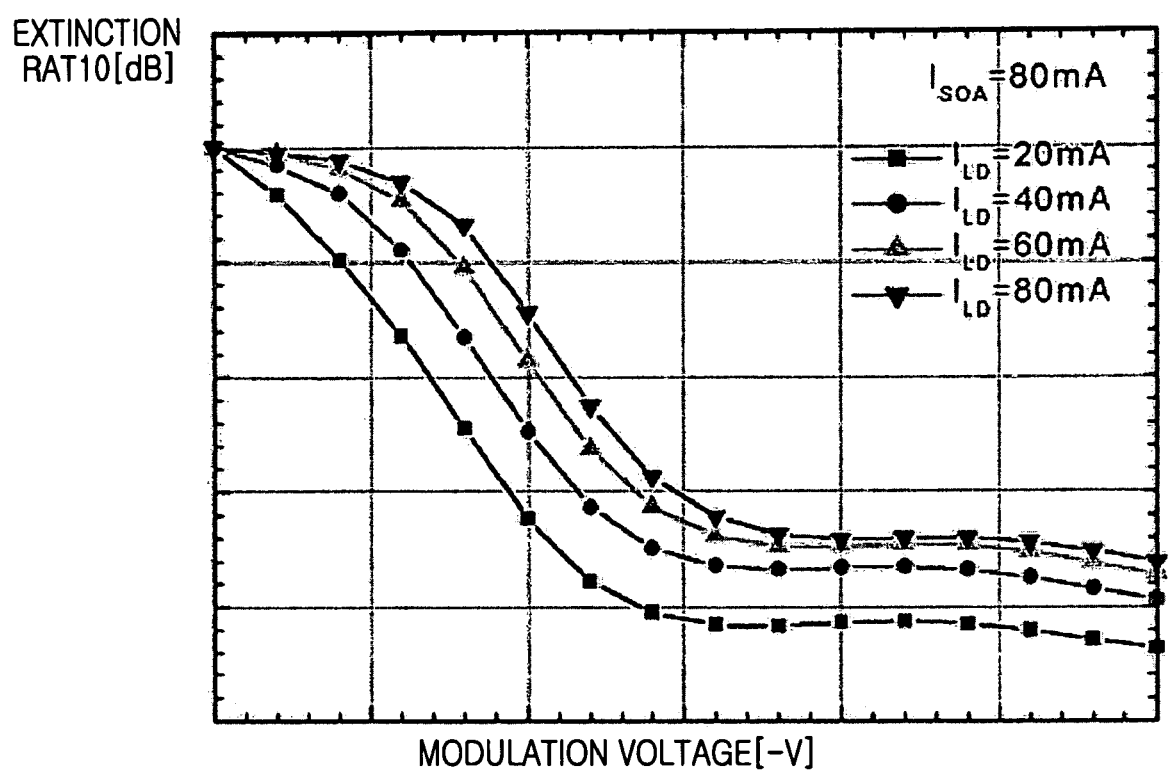
FIG. 6 is a graph illustrating a modulation characteristic of the electro-absorption modulator shown in FIG. 3.
Figure 7:
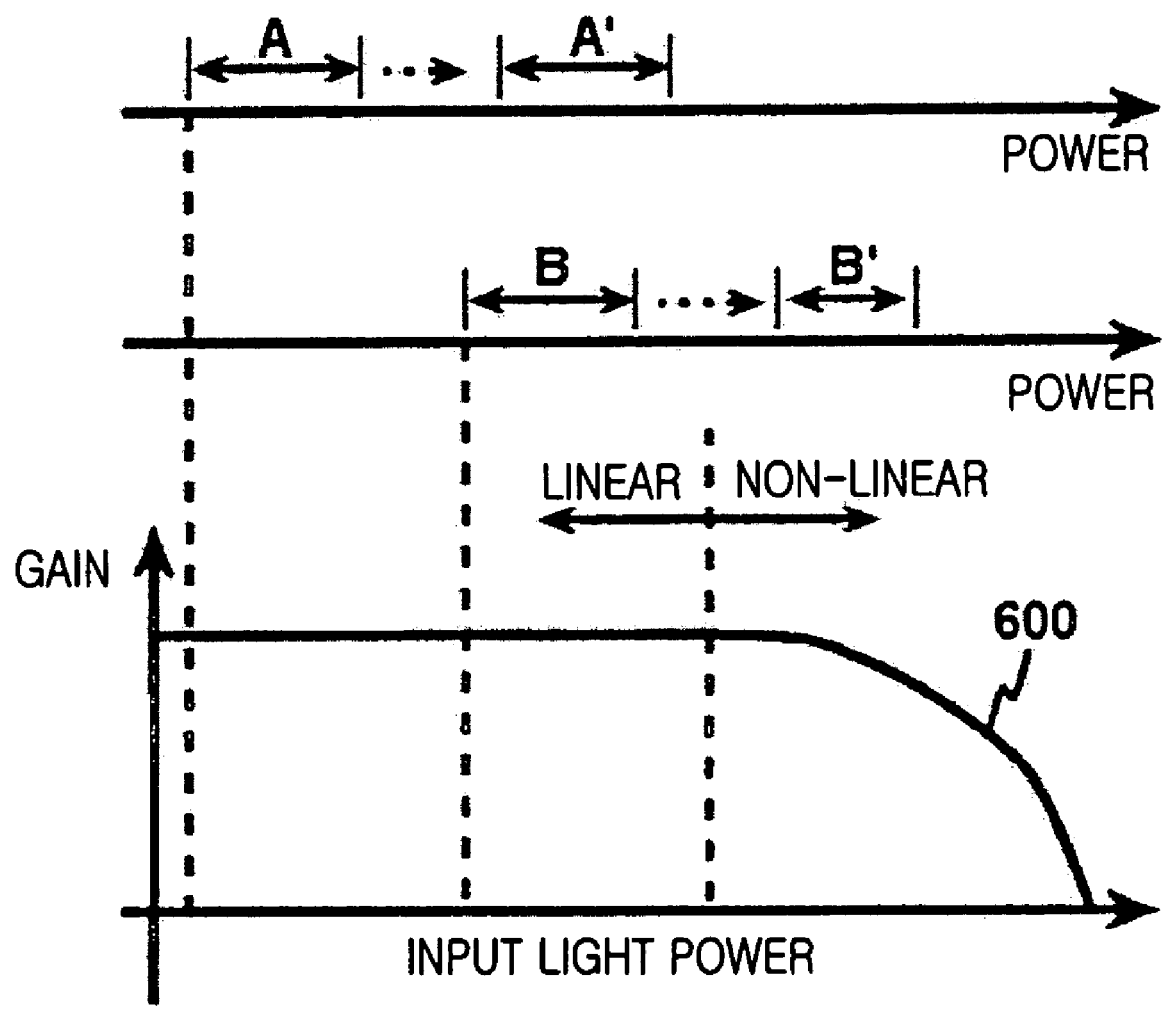
FIG. 7 is a graph illustrating a linear and non-linear amplification characteristic of a semiconductor optical amplifier shown in FIG. 3.
Figure 8:
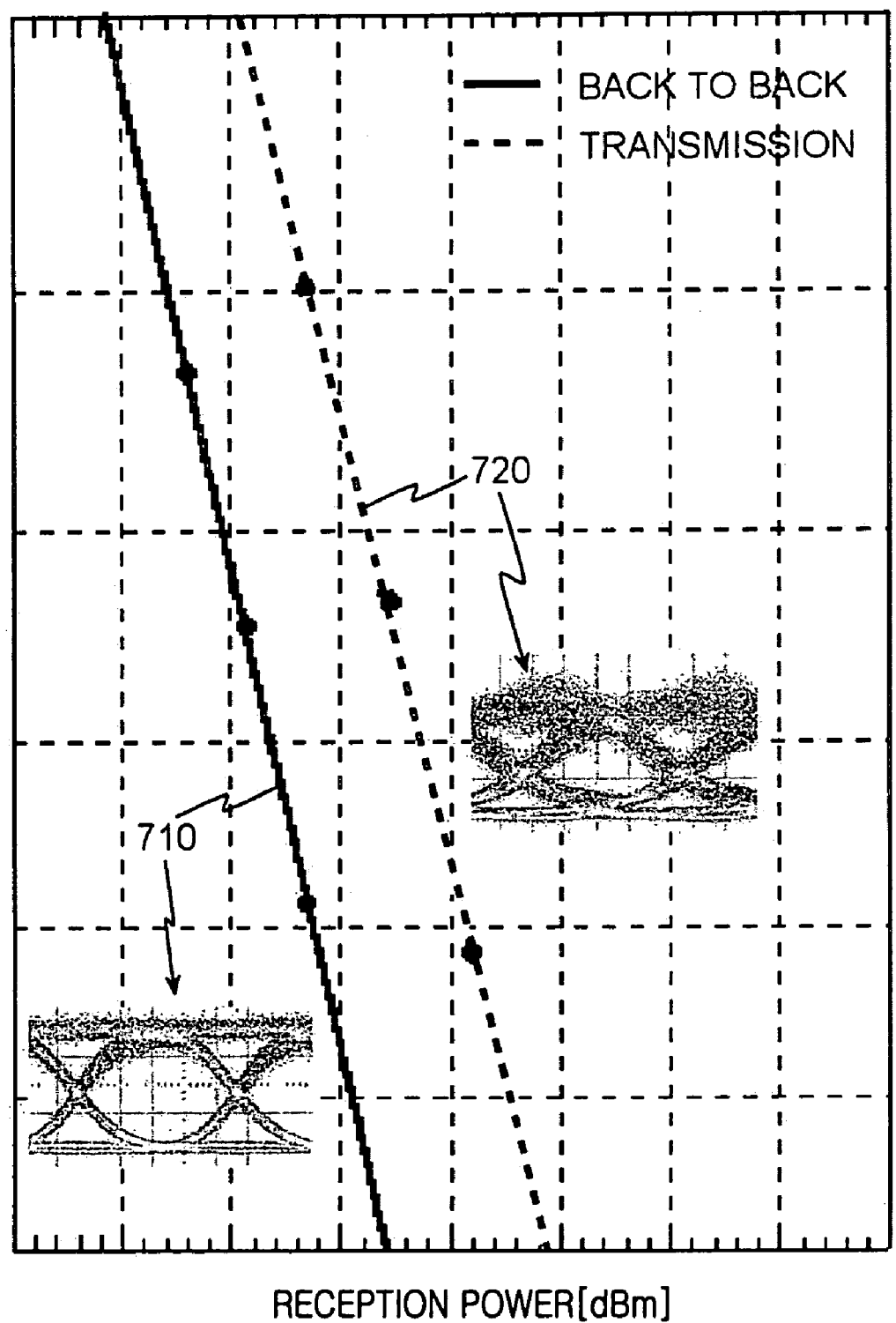
FIG. 8 is a graph illustrating a transmission characteristic of the optical transmitter shown in FIG. 3.

FIGS. 5a and 5b are graphs illustrating variation of an absorption curve of the EA MOD 460 according to the on and off state of light. FIG. 6 is a graph illustrating a modulation characteristic of the EA MOD 460. FIG. 7 is a graph illustrating a linear and non-linear amplification characteristic of the SOA 470, and FIG. 8 is a graph illustrating a transmission characteristic of the optical transmitter 300. Hereinafter, the operation of the optical transmitter 300 will be described with reference to FIGS. 3 to 8.

The DFB LD 450 shares the semiconductor substrate 310 and a common electrode. It also includes the first active layer 320, the diffraction grating 315 and the first upper electrode 390. Electrons from the semiconductor substrate 310 move to the first active layer 320 and holes from the upper clad layer 380 move to the first active layer 320, when a current is applied to the first upper electrode 390 and an electric field is formed in the DFB LD 450. Such reunion of the electrons and holes generates light in the first active layer 320. The diffraction grating 315 adjusts an oscillation wavelength of the DFB LD 450. In particular, the light generated in the first active layer 320 is filtered by the diffraction grating 315 on the basis of a predetermined wavelength. That is, from among the light inputted to the diffraction grating 315, some light having a predetermined wavelength are diffracted by the diffraction grating 315. The light is then guided along the first active layer 320 while oscillating a laser through a stimulated emission.

The EA MOD 460 shares the semiconductor substrate 310 and a common electrode. It also includes the second active layer 330 and the second upper electrode 400. The second active layer 330 has a characteristic in which absorbency changes according to a voltage applied to the second upper electrode 400. In order to modulate intensity of light oscillated in the DFB LD 450, the EA MOD 460 has an absorbency that is low in a low voltage and is high in a high voltage. An absorption edge wavelength of the EA MOD 460 is larger than that of the light.

The SOA 470 shares the semiconductor substrate 310 and a common electrode. It also includes the third active layer 340 and the third upper electrode 410. The third active layer 340 has a a gain that changes according to a current applied to the third upper electrode 410. Further, the SOA 470 amplifies and outputs inputted lights. The length and wavelength in a gain peak of the SOA 470 are set to meet required gain and saturation output.

The first optical attenuator 350 is located between the first and second active layers 320 and 330. The second optical attenuator 360 is disposed between the second and third active layers 330 and 340. Each of the first and the second optical attenuators 350 and 360 increases optical coupling loss between two adjacent active layers and attenuates inputted light.

The window 370 is located at one end of the SOA 470 and diverges light inputted from the third active layer 340. In this manner, light amplified in the course of progressing in the reverse direction after having been reflected in one end of the optical transmitter 300 is prevented from exerting a bad influence on the DFB LD 450.

The antireflection layer 440 is coated on one end of the SOA 470 side in the optical transmitter 300. This minimizes light reflected by one end of the optical transmitter 300 together with the window 370.

The first to the third electrodes 390, 400 and 410 are formed on each upper portion of the DFB LD 450, the EA MOD 460 and the SOA 470, respectively. In order to insulate the first to the third electrode 390, 400 and 410 from each other, trench 420 is formed between the first electrode 390 and the second electrode 400 and trench 430 is formed between the second electrode 400 and the third electrode 410.

FIG. 5a is a view showing a characteristic curve of each component when the optical transmitter 300 outputs light 515 in an on state. FIG. 5b is a view showing characteristic curve of each component when the optical transmitter 300 outputs light 515 in an off state. FIGS. 5a and 5b show a characteristic curve 530 of the SOA 470, a characteristic curve 510 of the DFB LD 450 and a characteristic curve 520 of the EA MOD 460.

The EA MOD 460 has the largest energy bandgap. The DFB LD 450 has the smallest energy bandgap. The absorption edge wavelength of the EA MOD 460 moves with respect to the oscillation wavelength of the DFB LD 450 according to the on and off state of the light 515. The power of the light 515 decreases or increases according to an increase or decrease of absorbency. Amplified spontaneous emission (hereinafter, referred to as ASE) light 535 generated in the SOA 470 is outputted to both sides of the SOA 470. Distortion of light 515 is caused when some of ASE lights 535 going toward the EA MOD 460 side are not absorbed but coupled to the first active layer 320. The coupled light exert an unwanted influence on an output characteristic of the optical transmitter 300. In order to prevent such influence, (1) the first optical attenuator 350 is located between the first active layer 320 and the second active layer 330, and (2) the second optical attenuator 360 is disposed between the second active layer 330 and the third active layer 340. Each of the first and the second optical attenuators 350 and 360 attenuates light inputted from an active layer located at one side and outputs the attenuated light to an active layer located at the other side. More particularly, the second optical attenuator 360 attenuates the ASE light 535 inputted from the third active layer 340 and enables the attenuated light to be coupled to the second active layer 330. The first optical attenuator 350 attenuates the ASE lights 535 inputted from the second active layer 330 and enables the attenuated lights to be coupled to the first active layer 320. For instance, as light outputted from an optical fiber in the air diverges, light inputted to the ends of optical attenuators 350 and 360 also diverge. Thus, only portion of the diverging lights are coupled to an active layer bordering to the other end of the first and the second optical attenuator 350 and 360. Herein, the other light not coupled to the active layer are incident into the upper clad layer 380 and the semiconductor substrate 310 and then disappear.

Further, the first optical attenuator 350 attenuates the power of the light inputted from the DFB LD 450 to the EA MOD 460. This mitigates a so-called hole pile-up phenomenon in the EA MOD 460. In the hole pile-up phenomenon, the absorbency of the second active layer 330 decreases when the intensity of the light inputted to the second active layer 330 exceeds a critical value.

FIG. 6 shows a first to a fourth extinction ratio curve representing variation of the extinction ratio with respect to a voltage applied to the EA MOD 460. The curves are distinguished according to a current $I_{LD}$ applied to the DFB LD 450 and a current $I_{SOA}$ applied to the SOA 470 is fixed. The extinction ratio of the EA MOD 460 is more than 15 dB and the extinction ratio characteristic is saturated due to a gain saturation phenomenon of the SOA 470 in a low voltage range with low absorbency.

Referring to gain curve 600 shown in FIG. 7, an amplification rate (or gain) of the SOA 470 changes according to the intensity of the inputted light. When the inputted light has a small intensity, the SOA 470 has a constant amplification rate, even if the light intensity increases to a certain degree. In contrast, when the inputted light has a large intensity, a gain saturation phenomenon occurs, in which the amplification rate decreases as the light intensity increases. In FIG. 7, reference numerals A and A' represent light in an off and on state when the SOA 470 operates in a linear gain range. Reference numerals B and B' represent light in an off and on state when the SOA 470 operates in a non-linear gain range. When the SOA 470 operates in a non-linear gain range, an output extinction ratio of the SOA 470 is smaller than an input extinction ratio. Advantageously, due to such operation in the non-linear gain range, (1) frequency chirp with respect to light with a large intensity in an on state can be compensated and (2) a frequency chirp component of light outputted from the optical transmitter 300 can be reduced. Therefore, the optical transmitter 300 has an improved output and transmission distance in contrast with the prior art.

FIG. 8 shows eye diagrams 710 and 720 before/after an optical transmission of an optical transmitter module including the optical transmitter 300. For such a measurement, the optical transmitter module includes a thermoelectric element, an optical detector, an isolator and a wavelength filter together with the optical transmitter 300 in a package. The optical transmitter 300 is attached to the thermoelectric element for a temperature control. A resistor of 50 Ω is connected to the EA MOD 460 to enable the optical transmitter 300 to operate at a speed of 10 Gbps. Some of light outputted from the optical transmitter 300 is detected by the optical detector. Other light is coupled to an optical fiber after passing through the isolator and the wavelength filter. The wavelength filter removes ASE light from among the light outputted from the optical transmitter 300. As shown in FIG. 8, both the eye diagram 720 after a transmission of 98 km (1600 ps/nm) and the eye diagram 710 before a transmission of 98 km (1600 ps/nm) show a clean state without a noise.

Advantageously, a single packaging of the optical transmitter is possible, since the semiconductor monolithic integrated optical transmitter according to the present invention is similar in size to that of a conventional optical device, such as a conventional EA MOD, integrated DFB LD and SOA. Further, the optical transmitter's power consumption is similar to an individual optical element. Thus, the present invention realizes a semiconductor monolithic integrated optical transmitter that has a ultra-miniaturized size and a low price. In addition, optical transmitter has a similar performance as existing conventional high power ultra-high speed optical transmitters.

Further, the semiconductor monolithic integrated optical transmitter of the present invention mitigates hole pile-up phenomenon of an EA MOD by adjusting an intensity of light inputted to an EA MOD. Further, the present invention performs long-distance transmission greater than a limited transmission distance when a SOA does not exist. This is accomplished by compensating for the frequency chirp of the EA MOD using the non-linear amplification characteristic of the SOA.

Furthermore, the optical transmitter of the present invention is idle for use in communication systems, since the optical transmitter is an ultra-high speed long-distance transmission part with a low power and a small scale. Accordingly, facilities and maintenance costs are reduced and substituting a high power ultra-high speed optical transmitter including the existing individual optical parts. Furthermore, since the system construction cost is inexpensive, a system including the semiconductor monolithic integrated optical transmitter can be applied to construct various communication environments.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A semiconductor optical transmitter including a plurality of active layers formed on a semiconductor substrate, the optical transmitter comprising:
   a distributed feedback laser diode including a grating that is configured to reflect light with a predetermined wavelength and a first active layer that is configured to oscillate light received from the grating;
   an electro-absorption modulator including a second active layer that is configured to receive light from the first active layer, wherein intensity of the light received from the first active layer is modulated through a change of absorbency in accordance with an applied voltage;
   an optical amplifier including a third active layer that is configured to amplify light received from the second active layer;
   a first bidirectional optical attenuator interposed between the first active layer and the second active layer; and
   a second bidirectional optical attenuator interposed between the second active layer and the third active layer.

2. The semiconductor optical transmitter as claimed in claim 1, wherein the semiconductor optical transmitter is a semiconductor monolithic integrated optical transmitter.

3. The semiconductor optical transmitter as claimed in claim 2, wherein the first bidirectional optical attenuator is formed between the distributed feedback laser diode and the electro-absorption modulator.

4. The semiconductor optical transmitter as claimed in claim 3, wherein the first optical attenuator is configured to mitigates hole pile-up in the electro-absorption modulator.

5. The semiconductor optical transmitter as claimed in claim 2, wherein the second bidirectional optical attenuator is formed between the electro-absorption modulator and the semiconductor optical amplifier.

6. The semiconductor optical transmitter as claimed in claim 5, wherein the second bidirectional optical attenuator is configured to adjusts intensities of light received by the semiconductor optical amplifier.

7. The semiconductor optical transmitter as claimed in claim 2, wherein the distributed feedback laser diode, the electro-absorption modulator and the semiconductor optical amplifier, each have respective different energy bandgaps.

8. The semiconductor optical transmitter as claimed in claim 2, wherein an energy bandgap of the electro-absorption modulator is largest and an energy bandgap of the distributed feedback laser diode is smallest.

9. The semiconductor optical transmitter as claimed in claim 2, wherein the third active layer of the optical amplifier has an adjustable gain in accordance with an applied current.

10. The semiconductor optical transmitter as claimed in claim 2, wherein the third active layer of the optical amplifier has a predetermined gain peak.

11. The semiconductor optical transmitter as claimed in claim 9, wherein the optical amplifier has a linear gain and a non-linear range mode of operation.

12. The semiconductor optical transmitter as claimed in claim 11, wherein the optical amplifier in the non-linear gain mode compensates for frequency chirp of the electro-absorption modulator.

13. The semiconductor optical transmitter as claimed in claim 2 further comprising a first trench interposed between the distributed feedback laser diode and the electro-absorption modulator.

14. The semiconductor optical transmitter as claimed in claim 13 further comprising a second trench interposed between the electro-absorption modulator and the optical amplifier.

15. The semiconductor optical transmitter as claimed in claim 1 further comprising a window being contiguous to the third active layer, being configured to receive light from the third active layer, and being configured to diverge light received from the third active layer.

16. The semiconductor optical transmitter as claimed in claim 2 further comprising an antireflection layer applied to an end of the transmitter, the end adjacent to the semiconductor optical amplifier.

17. The semiconductor optical transmitter as claimed in claim 1, wherein the first bidirectional optical attenuator is configured to mitigate hole pile-up in the electro-absorption modulator.

18. The semiconductor optical transmitter as claimed in claim 1, wherein the first bidirectional optical attenuator has a thickness larger than that of the first and second active layers to diverge light received from the first active layer or the second active layer.

19. The semiconductor optical transmitter as claimed in claim 1, wherein the second bidirectional optical attenuator has a thickness larger than that of the second and third active layers to diverge light received from the second active layer or the third active layer.

* * * * *